(12) United States Patent
van den Brand et al.

(10) Patent No.: US 9,437,510 B2
(45) Date of Patent: Sep. 6, 2016

(54) OPTO-ELECTRICAL DEVICE AND METHOD FOR MANUFACTURING THEREOF

(75) Inventors: Jeroen van den Brand, Goirle (NL); Herbert Lifka, Son en Breugel (NL); Edward Willem Albert Young, Maastricht (NL)

(73) Assignees: Nederlandse Organisatie Voor Toegepast-Natuurwetenschappelijk Onderzoek TNO, Delft (NL); Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 13/582,765

(22) PCT Filed: Mar. 1, 2011

(86) PCT No.: PCT/NL2011/050141
§ 371 (c)(1),
(2), (4) Date: Dec. 18, 2012

(87) PCT Pub. No.: WO2011/108921
PCT Pub. Date: Sep. 9, 2011

(65) Prior Publication Data
US 2013/0087824 A1    Apr. 11, 2013

(30) Foreign Application Priority Data
Mar. 5, 2010 (EP) .................................... 10155599

(51) Int. Cl.
*H01L 23/06* (2006.01)
*H01L 51/44* (2006.01)
(Continued)

(52) U.S. Cl.
CPC ........... *H01L 23/06* (2013.01); *H01L 31/0203* (2013.01); *H01L 31/18* (2013.01);
(Continued)

(58) Field of Classification Search
None
See application file for complete search history.

(56) References Cited

U.S. PATENT DOCUMENTS 6,506,616 B1    1/2003  Kim et al.
2005/0093001 A1    5/2005  Liu et al.
(Continued)

FOREIGN PATENT DOCUMENTS

DE    WO2007013001 A2 *    2/2007    ............ 257/678
EP    21449290    1/2010
(Continued)

OTHER PUBLICATIONS

International search report for PCT/NL2011/050141, mailed Jul. 20, 2011.

*Primary Examiner* — Steven Loke
*Assistant Examiner* — Juanita Rhodes
(74) *Attorney, Agent, or Firm* — Patterson Intellectual Property Law, P.C.; James R. Cartiglia; Timothy L. Capria (57) ABSTRACT

An opto-electrical device is provided that comprises a cover (10), a barrier structure (20), an opto-electrical structure (30) and a plurality of transverse electrical conductors (40). Therein—the cover (10) includes a metal foil (12) and a patterned electrically conductive layer (14) carried by and electrically insulated from the metal foil,—the opto-electrical structure (30) is sandwiched between the cover (10) and the barrier structure (20), wherein the opto-electrical structure (30) comprises at least an opto-electrical layer (32) and a transparent electrically conductive layer (34), the opto-electrical structure having a first main surface (31) facing towards the cover (10),—the plurality of transverse electrical conductors (40) extend from the metal foil (12) or the patterned electrically conductive layer (14) of the cover (10) through the at least one opto-electrical layer (32) to said transparent electrically conductive layer (34),—the cover (10) extends beyond said first main surface (31) of the opto-electrical structure (30).

9 Claims, 6 Drawing Sheets

(51) Int. Cl.
  *H01L 51/52* (2006.01)
  *H01L 31/0203* (2014.01)
  *H01L 33/00* (2010.01)
  *H01L 31/18* (2006.01)
  *H01L 33/52* (2010.01)

(52) U.S. Cl.
  CPC ............ *H01L 33/005* (2013.01); *H01L 33/52* (2013.01); *H01L 51/448* (2013.01); *H01L 51/5212* (2013.01); *H01L 51/5237* (2013.01); *H01L 51/5243* (2013.01); *H01L 51/5256* (2013.01); *H01L 2251/5361* (2013.01); *H01L 2924/0002* (2013.01); *Y02E 10/549* (2013.01); *Y02P 70/521* (2015.11)

(56) References Cited

U.S. PATENT DOCUMENTS

2005/0224935 A1* 10/2005 Schaepkens ........ H01L 51/0097
            257/678
2006/0278965 A1* 12/2006 Foust .................. H01L 51/5237
            257/678
2008/0211402 A1    9/2008 DeCook et al.
2009/0130941 A1    5/2009 Boroson et al.

FOREIGN PATENT DOCUMENTS

| JP | H1-142197 A | 9/1989 | |
| JP | 09-129369 | 5/1997 | |
| JP | 2007531238 | 11/2007 | |
| JP | 2008103254 | 1/2008 | |
| JP | 2009503777 | 1/2009 | |
| NL | EP2144290 A1 * | 1/2010 | .................... 257/678 |
| NL | EP 2144290 A1 * | 1/2010 | ......... H01L 27/3202 |
| WO | 2005104266 | 11/2005 | |
| WO | 2007013001 | 2/2007 | |
| WO | 2009086095 A2 | 7/2009 | |
| WO | 2010005301 | 1/2010 | |

* cited by examiner

OPTO-ELECTRICAL DEVICE AND METHOD FOR MANUFACTURING THEREOF

BACKGROUND OF THE INVENTION

1. Field of the Invention

The present invention relates to an opto-electrical device. The present invention further relates to a method for manufacturing an opto-electrical device.

2. Related Art

Opto-electric devices are understood herein to be devices that convert an electric power into photon radiation, that convert photon radiation into electric power or that change a property of photon radiation under control of an electric signal. Opto-electric devices comprise an opto-electric layer that is arranged between a first and a second electrode. At least one of the electrodes should be transparent, i.e. it should transmit a substantial amount, i.e. at least 50%, preferably at least 80% of photon radiation impingent thereon. This can be photon radiation rendered by the opto-electric layer for transmission to outside the device, or can be photon radiation from outside the device for transmission to the opto-electric layer. At the same time however, this electrode should provide a low-ohmic contact to external power conduction lines. A low-ohmic contact is in particular a point of concern for large area opto-electric devices. In this connection a large area is understood to be an area larger than 10 cm².

EP2144290 discloses an electronic device that comprises a functional stack and a cover coupled thereto by an electrically insulating adhesive layer. The functional stack comprises a first transparent and electrically conductive layer, a second electrically conductive layer and a functional structure, comprising at least one layer, sandwiched between said first and second conductive layer. The cover includes a substrate and at least a first conductive structure that is arranged in a first plane between the adhesive layer and the substrate. First and second transverse electrical conductors transverse to the first plane electrically interconnect the first and the second electrically conductive layer with the first and the second conductive structure in the first plane. The cover includes a barrier layer that serves as a barrier against moisture and other substances in the atmosphere that may interact with the materials of the functional structure. The first and the second electrically conductive layer are connected to a main conductor that extends in a transverse direction through the cover. In this way an electric power can be applied to the device also if its sides are sealed with a barrier material.

WO2007/013001 discloses an organic electroluminescent device with a flexible foil as top sealing and interconnection. The flex foil is a layer with a polyimide core with copper layers on both sides in order to realize an interconnection between the inner O-LED and the outer conducting paths. O-LED cells are located between the flex foil and the transparent substrate. The O-LED cells themselves consist of a conducting layer on one side and a transparent conducting layer on the other side which faces the transparent substrate. The conducting layers of the O-LEDs are bonded with conducting posts, which interconnect these conducting rear sides of the O-LEDs with the copper layers of the flex foil.

It is a purpose of the present invention to provide an improved opto-electronic device.

SUMMARY OF THE INVENTION

According to a first aspect of the invention an opto-electrical device comprising a cover, a barrier structure, an opto-electrical structure and a plurality of transverse electrical conductors is provided. Therein the cover comprises a metal foil and a patterned electrically conductive layer carried by and electrically insulated from the metal foil, the opto-electrical structure is sandwiched between the cover and the barrier structure, wherein the opto-electrical structure comprises at least an opto-electrical layer and a transparent electrically conductive layer, the opto-electrical structure having a first main surface facing towards the cover, the plurality of transverse electrical conductors extend from the metal foil or from the patterned electrically conductive layer of the cover through the at least one opto-electrical layer to said transparent electrically conductive layer, the cover extends beyond said first main surface of the opto-electrical structure and is wrapped around at least one side face of the device over the barrier structure.

In the opto-electrical device according to the first aspect of the invention the cover formed by the metal foil and the patterned electrically conductive layer carried by and electrically insulated from the metal foil functions as a barrier, while also forming a power supply plane or power collecting plane that gives a balanced electrical access over the entire plane comprising the opto-electrical structure, while both the metal foil and the patterned electrical layer can be easily connected on their turn to external power lines in an extending portion of said cover.

The wrapped cover provides for an electrical connection for the opto-electrical structure and obviates at least the sealing at said side-face.

It is noted that U.S.2005/224935 describes organic electronic packages with sealed edges formed by edge wraps that completely surround the organic electronic device. U.S.2005/224935 notes that the superstrate may be insulative or conductive and the organic package may be configured such that the superstrate may provide a bus-bar contact to the organic electronic device 16 that if the superstrate is conductive. As the superstrate proposed in this U.S. patent application should be either insulative or conductive, it is excluded that it comprises a metal foil and a patterned electrically conductive layer carried by and electrically insulated from the metal foil as in the cover of the device according to the first aspect of the invention. The latter comprises both insulating parts.

In an embodiment of the opto-electrical device according to the first aspect of the invention the patterned electrically conductive layer is a grid, that is electrically insulated from the metal foil by an electrically insulating layer that is applied as a pattern that defines openings in areas not covered by the patterned electrically conductive layer that give access to the metal foil at the side of the cover facing the opto-electrical structure.

This embodiment is advantageous in that the cover can be easily manufactured by applying the patterned electrically insulating layer and the patterned electrically conductive layer by printing on the metal foil.

In another embodiment of the opto-electrical device according to the first aspect of the invention the patterned electrically conductive layer is applied at an electrically insulating layer, the cover further comprising electrical feedthrough elements that are electrically coupled to the metal foil that extend through the electrically insulating layer and in an electrically insulated manner through the patterned electrically conductive layer.

In this embodiment the cover may be prepared by a blanket deposition of an electrically insulating layer and an electrically conductive layer at the metal foil, followed by a patterning step of the deposited layers, e.g. by laser drilling.

According to a second aspect of the invention a method for manufacturing an opto-electrical device is provided comprising the steps of
- providing a cover comprising a metal foil, and a patterned electrically conductive layer carried by and electrically insulated from the metal foil,
- providing an opto-electrical structure that comprises at least an opto-electrical layer and a transparent electrically conductive layer,
- providing a plurality of transverse electrical conductors that extend from the metal foil or from the patterned electrically conductive layer of the cover through the at least one opto-electrical layer to said transparent electrically conductive layer
- providing a barrier structure, wherein the opto-electrical structure is sandwiched between the cover and the barrier structure, and wherein the cover extends beyond said first main surface of the opto-electrical structure.

The method according to the second aspect of the invention provides a practical method to manufacture a device according to the first aspect of the invention.

BRIEF DESCRIPTION OF THE DRAWINGS

These and other aspects of the present invention are described in more detail with reference to the drawings. Therein

DETAILED DESCRIPTION OF EMBODIMENTS

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

As used herein, a "layer" of a given material includes a region of that material whose thickness is small compared to both its length and width. Examples of layers include sheets, foils, films, laminations, coatings, and so forth. As used herein a layer need not be planar, but can be bent, folded or otherwise contoured, for example, to at least partially envelop another component. As used herein a layer can also include multiple sub-layers. A layer can also consist of a collection of discrete portions, for example, a layer of discrete active regions comprising individual pixels.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In case of conflict, the present specification, including definitions, will control. In addition, the materials, methods, and examples are illustrative only and not intended to be limiting.

Figure 1:
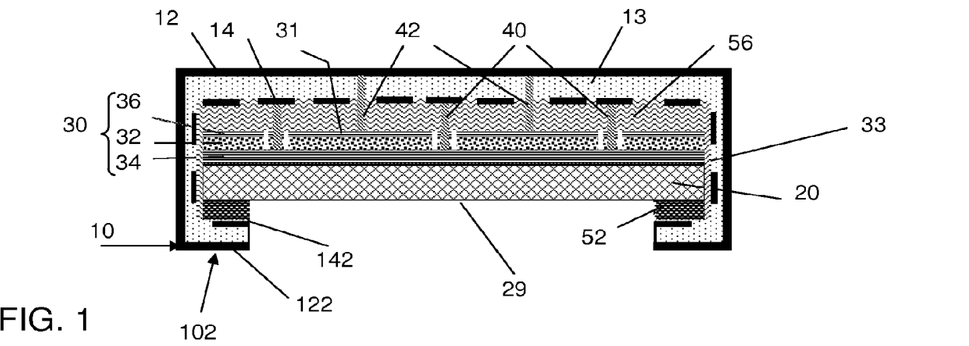
FIG. 1 shows a first embodiment of an opto-electrical device according to the first aspect of the present invention.

Throughout the drawings like parts have like reference numerals. FIG. 1 shows a first embodiment of an opto-electrical device comprising a cover 10, a barrier structure 20, an opto-electrical structure 30 and a plurality of transverse electrical conductors 40. In particular the opto-electrical device is an organic opto-electrical device as it comprises one or more layers of organic materials.

Therein the cover 10 includes a metal foil 12, and a patterned electrically conductive layer 14 carried by and electrically insulated from the metal foil.

The opto-electrical structure 30, that is sandwiched between the cover 10 and the barrier structure 20, comprises at least an opto-electrical layer 32 and a transparent electrically conductive layer 34. The device comprises a further electrically conductive layer 36 that does not need to be transparent. The opto-electrical structure has a first main surface 31 facing towards the cover 10.

In this embodiment the plurality of transverse electrical conductors 40 extend from the patterned electrically conductive layer 14 of the cover 10 through the at least one opto-electrical layer 32 to the transparent electrically conductive layer 34 so that the transparent electrically conductive layer 34 is electrically coupled to the patterned electrically conductive layer 14. In an alternative embodiment the plurality of transverse electrical conductors 40 extend from the metal foil 12 of the cover 10 through the at least one opto-electrical layer 32 to the transparent electrically conductive layer 34 so that the transparent electrically conductive layer 34 is electrically coupled to the metal foil 12.

In this embodiment the opto-electrical device may be an OLED, a photovoltaic cell or an electrochromic element (in this case a mirror having electrically controllable optic properties).

The metal foil 12 used in the device may be have a thickness depending on the desired strength and flexibility of the device. In the embodiment shown the metal foil is for example a foil of aluminium, copper, silver or stainless steel for example having a thickness of 0.005 to 0.5 mm, e.g. 0.125 mm. In this embodiment the electrically insulating layer 13 is formed by a polymer foil. For example a PET (Poly Ethylene Terephthalate) foil, a PEN (Poly Ethylene Naphthalate) foil or a PC (polycarbonate) foil may be used. The polymer foil may have a thickness in the range of 5 to 500 μm, for example 125 or 50 μm. The patterned electrically conductive layer 14 is another metal layer, for example having a thickness in the range of 1 μm to 1 mm, e.g. having a thickness of about 0.1 mm that may be coated with a high reflective conductive layer.

The opto-electrical structure may comprise a single opto-electric layer or a combination of opto-electric layers. The opto-electrical structure may comprises additional layers, e.g. a hole-injection layer, a hole transport layer, an electron-injection layer and an electron transport layer. Various materials are suitable for the anode of the device. In case the transparent electrically conductive layer 34 forms the anode the conductive material to be used for the anode is for example a polymer like polyaniline, polythiophene, polypyrrole or a doped polymers. Apart from organic materials, various inorganic transparent, electrically conducting materials are available like ITO (Indium Tin Oxide), IZO (Indium Zinc Oxide), ATO (Antimony Tin Oxide), or Tin Oxide can be used. Other metal oxides can work, including but not limited to Nickel-Tungsten-Oxide, Indium doped Zinc Oxide, Magnesium-Indium-Oxide. In a typical embodiment a transparent anode is formed by an ITO-layer having a thickness in the range of 100 to about 600 nm.

Suitable materials for the cathode of the device are metals or nonmetals having a lower work function than the first electrical contact layer (in this case, the anode layer). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs,), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer include, but are not limited to, barium, lithium, cerium, cesium, europium, rubidium, yttrium, magnesium, samarium, and alloys and combinations thereof.

In a practical example the cathode is a layer of Ba having a thickness of about 5 nm combined with a layer of aluminium having a thickness in the range of 100-400 nm. However the cathode is is selected as the transparent electrically conductive layer 34, only a single layer of Ba may be used that is coupled by the transverse electrical conductors 40 to the metal foil 12 or the patterned electrically conductive layer 14.

As used herein, "transparent" refers to a material allowing a total transmission of at least about 50%, preferably at least about 80%, of visible light (i.e., having a wave length in the range from about 400 nm to about 700 nm).

The barrier structure 20 usually comprises a stack of layers of different materials alternating each other. The stack may comprise inorganic and organic layers that alternate each other or inorganic layers that alternate each other. The organic layers may be provided from a cross-linked (thermoset) material, an elastomer, a linear polymer, or a branched or hyper-branched polymer system or any combination of the aforementioned, optionally filled with inorganic particles of a size small enough to still guarantee light transmission. The material is processed either from solution or as a 100% solids material. Curing or drying may exemplary occur by irradiation of the wet material, pure, or suitably formulated with a photo-or heat-sensitive radical or super-acid initiator, with UV-light, visible light, infrared light or heat, E-beam, g-rays or any combination of the aforementioned. The material of the organic layer preferably has a low specific water vapour transmission rate and a high hydrophobicity. Examples of suitable cross-linking (thermoset) systems are any single one or any combination of aliphatic or aromatic epoxy acrylates, urethane acrylates, polyester acrylates, polyether acrylates, saturated hydrocarbon acrylates, epoxides, epoxide-amine systems, epoxide-carboxylic acid combinations, oxetanes, vinyl ethers, vinyl derivatives, and thiol-ene systems. Suitable examples of elastomeric materials are polysiloxanes. Examples of suitable branched or linear polymeric systems are any single one or any copolymer or physical combination of polyacrylates, polyesters, polyethers, polypropylenes, polyethylenes, polybutadienes, polynorbornene, cyclic olefin copolymers, polyvinylidenefluoride, polyvinylidenechloride, polyvinylchloride, polytetrafluoroethylene, polychlorotrifluoroethylene, polyhexafluoropropylene. The organic layers may have a thickness between 0.1-100 μm, preferably between 5 and 50 μm.

The inorganic layer(s) may be any ceramic including but not limited to metal oxide, such as indium oxide (In2O3), tin oxide (SnO2), indium tin oxide (ITO), a metal nitride, such as aluminium nitride (AlN), silicon nitride (SiN), a carbide, such as silicon carbide, a metal oxynitride, e.g. siliconoxynitride, or any other combination such as metal oxy carbides, metal carbonitrides, metal oxycarbonitrides. In case that the electronic device has an optical function it is relevant that at least one side (foundation or cover) is substantially transparent ceramic. Suitable materials therefore are for example silicon oxide (SiO2), aluminum oxide (Al2O3), titanium oxide (TiO2), indium oxide (In2O3), tin oxide (SnO2), indium tin oxide (ITO, In2O3+SnO2), (SiC), silicon oxynitride (SiON) and combinations thereof.

The inorganic layers have a water vapour transmission rate of at most $10^{-4}$ $g \cdot m^{-2} \cdot day^{-1}$.

The inorganic layer(s) are in practice substantially thinner than the organic layers. The inorganic layers should have a thickness in the range of 10 to 1000 nm, preferably in the range of 100 to 300 nm.

The barrier structure 20 may be carried by a substrate, e.g. a glass plate or a polymer foil.

In a typical example the barrier structure 20 comprises a so-called NONON-barrier layer, comprising a stack of sublayers, in this case siliconnitride-layers, and siliconoxide layers that alternate each other.

In the embodiment shown the opto-electrical structure 30 is coupled to the cover 10 with an adhesive layer 56. The transverse electrical conductors 40 extend through this adhesive layer 56. The device shown in FIG. 1 comprises further transverse electrical conductors 42 that electrically couple the metal foil 12 to a further electrode 32 of the opto-electrical structure.

The cover 10 extends beyond said first main surface 31 of the opto-electrical structure 30 so that the ends 102 of the cover can provide electrical contacts 122 and 142 to the metal foil 12 and the patterned electrical conductive layer 14 respectively.

In the embodiment shown the cover 10 is wrapped around at least one side face 33 of the device over the barrier structure 20. Therewith the metal foil 12 of the portion of the cover 10 wrapped around that side face 33 counteracts penetration of moisture and other malign atmospheric substances in said side face 33.

Figure 2:
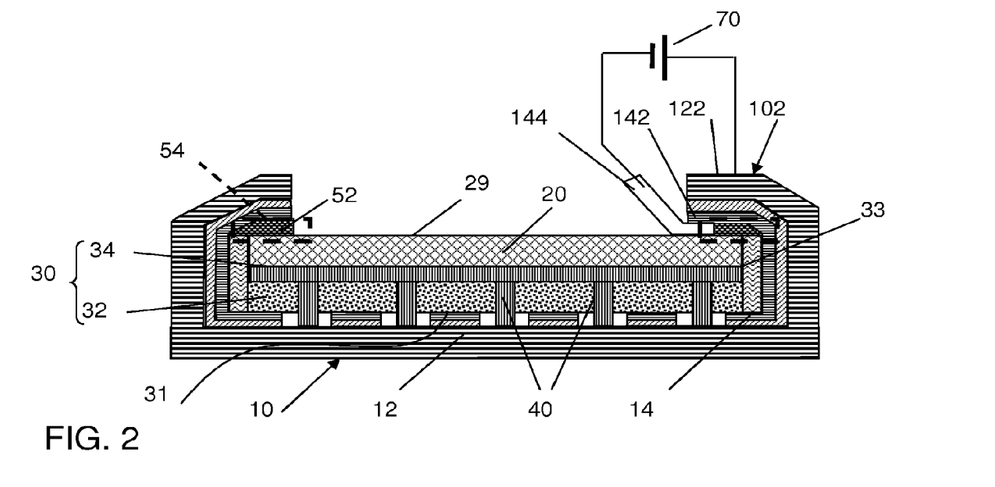
FIG. 2 shows a second embodiment of an opto-electrical device according to the first aspect of the present invention.

In the embodiment the cover 10 is wrapped around the full periphery of the opto-electrical structure 30 and is adhered by a sealant 52 to a surface 29 of the barrier structure 20 facing away from the opto-electrical structure 30. A portion of said surface 29 provided with the sealant 52 is denoted the adhesion zone 54. The adhesion zone 54 extends along the full periphery of the surface 29. In this way a full encapsulation is provided by the metal foil 12 of the cover 10 in combination with the barrier structure 20. Suitable materials for use as a sealant are epoxy resins or acrylate resins filled with inorganic particles FIG. 2 shows a further embodiment of an opto-electrical device according to the first aspect of the invention. In the embodiment of FIG. 2, the cover has a free edge-portion 102 that extends beyond the adhesion zone 54 and that is bent away from the barrier structure 20. Therewith a portion 142 of the patterned electrical layer 14 becomes exposed allowing for a simple connection to a power source 70.

In the embodiment shown the opto-electrical structure 30 is applied directly against the cover 10 and the patterned electrically conductive layer 14 functions as a further electrode of the opto-electrical structure 30. The transverse electrical conductors 40 provide for an electrical connection between the metal foil 12 and the transparent electrically conductive layer 34.

As in the embodiment shown in FIG. 1, the cover 10 is wrapped around the full periphery of the opto-electrical structure 30 and is adhered by a sealant 52 to a surface 29 of the barrier structure 20 facing away from the opto-electrical structure 30. In this embodiment as shown in FIG. 2, the cover has an edge-portion 102 where the patterned electrically conductive layer 14 is applied against an electrical contact 144 fixed at the barrier structure 20.

Figure 3:
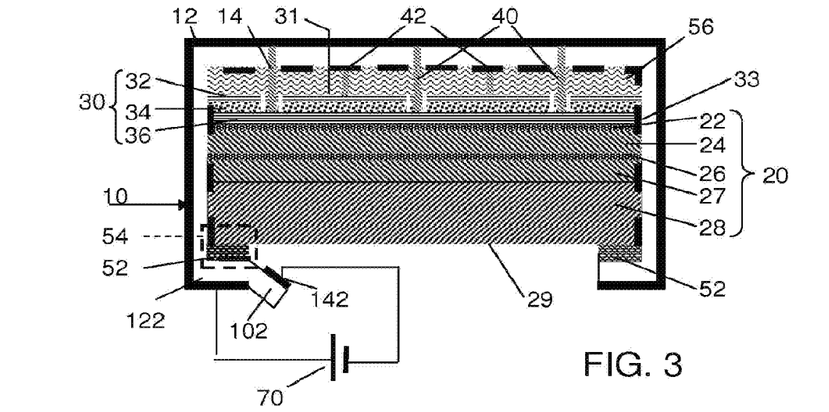
FIG. 3 shows a first embodiment of an opto-electrical device according to the first aspect of the present invention.

FIG. 3 shows an alternative embodiment. This embodiment differs from the embodiment shown in FIG. 1 in that the transverse electrical conductors 40 extend from the metal foil through the adhesive layer 56 and the opto-electric layer 32 to the transparent electrically conductive layer 34.

The cover 10 of the opto-electrical device is adhered in an adhesion zone 54 to a surface 29 of the barrier structure 20 facing away from the opto-electrical structure 30. The cover 10 has a free edge-portion 102 that extends beyond the adhesion zone 54 and that is bent away from the barrier structure 20. Therewith a contact 142 of the patterned electrically conductive layer is exposed that can be used to connect to a power supply 70. In the embodiment shown the barrier structure 20 comprises inorganic layer 22, 26 that sandwich an organic layer 24, an organic planarization layer 27 and an organic substrate 28.

Figure 4A:
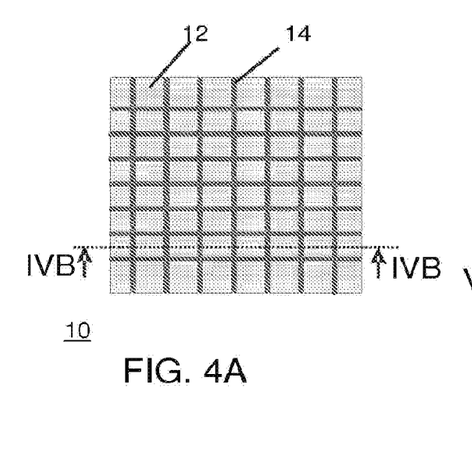
FIG. 4A shows a first embodiment of a semi-finished product for use in the present invention.
Figure 4B:
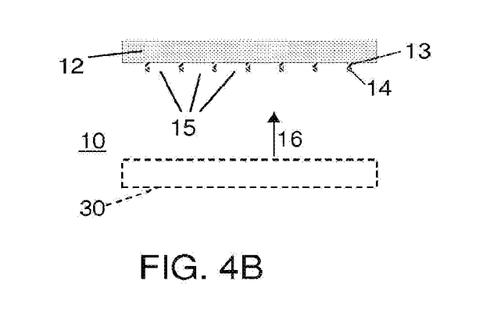
FIG. 4B shows a cross-section according to IVB-IVB in FIG. 4A.

Several options are possible for the cover. FIG. 4A and 4B show a first embodiment. Therein FIG. 4A is a view of the cover 10 as seen from the opto-electric structure and FIG. 4B shows a cross-section according to IVB-IVB in FIG. 4A. Therein the patterned electrically conductive layer 14 is a grid, that is electrically insulated from the metal foil 12 by an electrically insulating layer 13 that is applied as a pattern that defines openings 15 in areas not covered by the patterned electrically conductive layer that give access to the metal foil 12 at the side 16 of the cover 10 facing the opto-electrical structure 30 (indicated by a dashed box).

This embodiment is advantageous in that the cover 10 can be easily manufactured by applying the patterned electrically insulating layer and the patterned electrically conductive layer by printing on the metal foil.

Figure 5A:
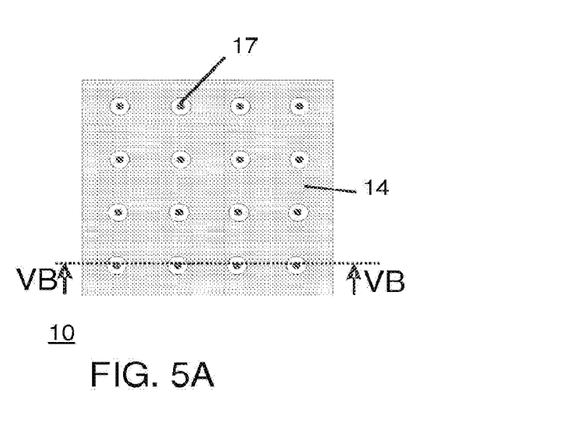
FIG. 5A shows a second embodiment of a semi-finished product for use in the present invention.
Figure 5B:
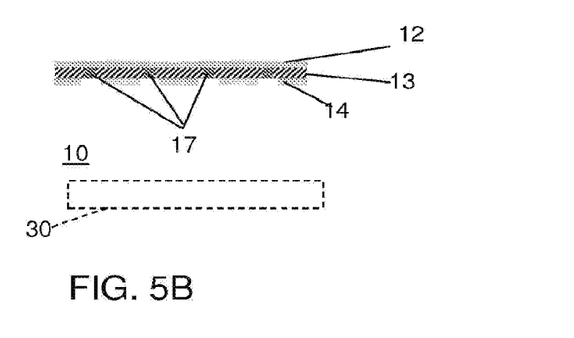
FIG. 5B shows a cross-section according to VB-VB in FIG. 5A, FIG. 6A to 6E show a first embodiment of a method according to the second aspect of the present invention.

FIG. 5A, 5B show another embodiment. Therein FIG. 5B is a cross-section according to VB-VB in FIG. 5A. In this embodiment the patterned electrically conductive layer 14 is applied at an electrically insulating layer 13. The cover further comprises electrical feedthrough elements 17 that are electrically coupled to the metal foil 12. The feedthrough elements extend through the electrically insulating layer 13 and in an electrically insulated manner through the patterned electrically conductive layer 14.

In this embodiment the cover may be prepared by a blanket deposition of an electrically insulating layer and an electrically conductive layer at the metal foil, followed by a patterning step of the deposited layers, e.g. by laser drilling and deposition of a conductive paste in the openings towards the metal foil 12.

Figure 6A:
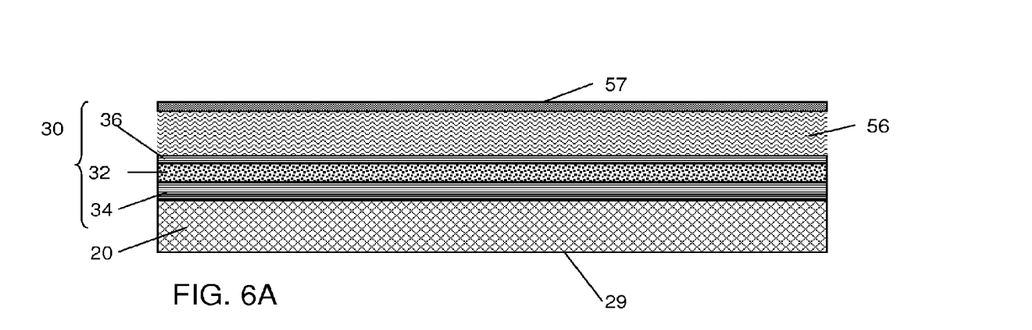

FIG. 6A to 6E illustrate a method for manufacturing an opto-electrical device according to the present invention. FIG. 6A shows the result of a first stage of manufacturing of the opto-electrical structure 30. The opto-electrical structure 30 is applied at a barrier structure 20. The barrier structure 20 is for example a glass plate, but may alternatively be another transparent structure having a barrier function, such as a polymer foil provided with a stack of organic and inorganic layers that alternate each other, or a stack of inorganic layers that alternate each other.

Organic layers may for example be deposited at the foil by gravure printing (in vacuum), or slot-die coating. Inorganic layers may be applied by vapor deposition process, e.g. by PECVD. The deposition may be preceded by a surface treatment. A first transparent electrically conductive layer 34 is applied, followed by the other layers of the opto-electrical structure 30, here including the opto-electrical layer 32 and the further electrode layer 36. The transparent electrically conductive layer 34, for example an ITO layer, may be applied by (rotatable) magnetron sputtering and subsequent annealing at a temperature of less than 150° C. The further electrically conductive layer 36 is for example applied by thermal evaporation. The further electrically conductive layer 36 may be a dual layer, for example comprising a relatively thick aluminum layer, e.g. 100 nm facing away from the opto-electrical layer 32 and a relatively thin Ba layer, e.g. of 5 nm, facing towards the opto-electrical layer. The opto-electric layer 32 may comprise one or more active sub-layers, e.g. electro-optically active layers, optical-electric active layers, hole injection layers, electron transport layers etc. The one or more active layers may for example be applied by one or more of the methods spin coating, gravure/flexo printing, and slot-die coating. The further electrically conductive layer 36 is provided with an electrically insulating adhesive layer 56, which is optionally covered with a release liner 57 on its turn. With these steps, requiring no patterning, the result shown in FIG. 6A is obtained.

Figure 6B:
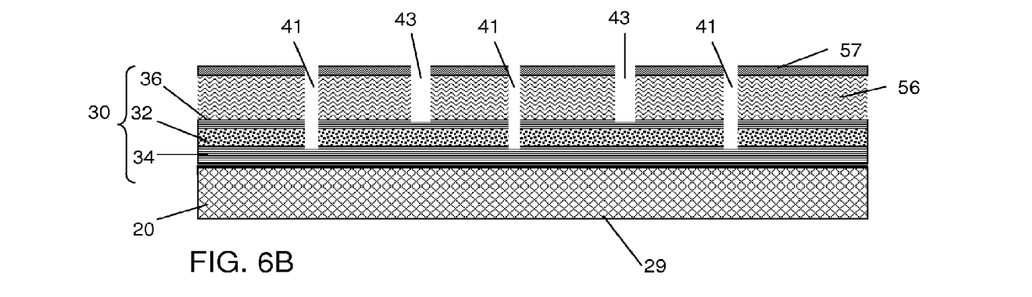

FIG. 6B shows how first and second holes 41, 43 having a diameter of 25-250 μm are formed through the adhesive layer 56 and the release liner 57. The first holes 41 extend towards the transparent electrically conductive layer 34. The second holes 43 extend towards the further electrically conductive layer 36.

Figure 6C:
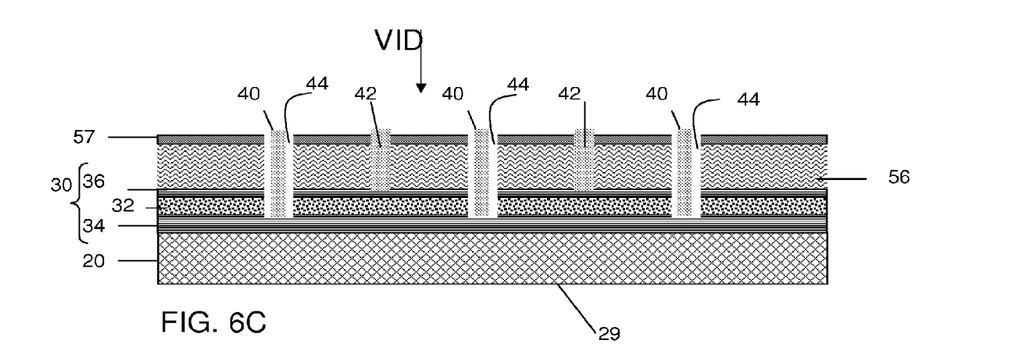

The result as shown in FIG. 6C is obtained by applying an electrical conductive material in the holes 41, 43 therewith forming electrical conductors 40, 42.

Materials suitable therefore are for example electrically conductive pasts, such as metal filled polymer pasts, e.g. epoxies, acrylates or silicons filled with Ag or Cu.

After application of the electrical conductors 40 a ring-shaped recess 44 having an outer diameter of for example 50-275 μm is formed around the electrically conductive material in the first holes 41. The ring-shaped recesses 44 are filled with an electrically insulating material but may alternatively be left free. The first and the second holes 41, 43, as well as the ring-shaped recesses 44 are preferably formed by laser drilling.

It is noted that instead of applying the holes 41, 43 in a single step after application of the last layer in this case the release liner 57, the holes 41, 43 and the recesses 44 may be formed alternatively by a patterned deposition of the layers of the opto-electrical structure 30, and laminating an adhesive layer 56 provided with perforations at the locations corresponding to the holes and the recesses.

Figure 6D:
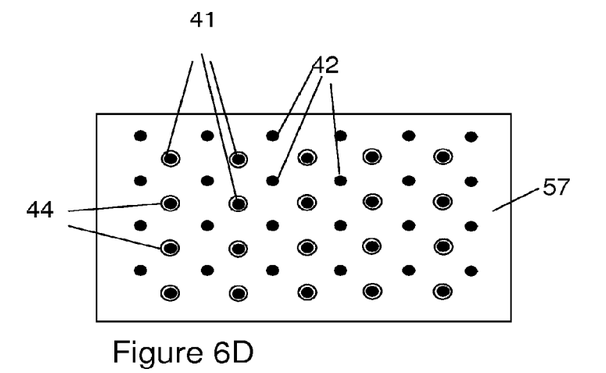

FIG. 6D shows a top-view according to VID in FIG. 6C. After removal of the release liner 57 the semi-finished product shown in FIG. 6C and 6D, comprising the opto-electrical structure 30 and the barrier structure 20 may be laminated to a cover 10 as shown in FIG. 4A, 4B or in FIG. 5A, 5B for example.

When laminating the semifinished product of 6C, 6D with the cover of FIG. 4A, 4B the ends of the electrical conductors 40 should coincide with the grid formed by patterned electrically conductive layer 14 and the ends of the electrical conductors 42 should coincide with the surface of the metal foil 12 left free by the patterned electrically conductive layer 14 and the electrically insulating layer 13. Alternatively, the ends of the electrical conductors 41 may coincide with the grid formed by patterned electrically conductive layer 14 and the ends of the electrical conductors 41 may coincide with the surface of the metal foil 12 left free by the patterned electrically conductive layer 14 and the electrically insulating layer 13. Generally speaking the transparent electrically conductive layer 34 of the opto-electrical structure 30 is preferably connected to the metal foil 12, as the transparent electrically conductive layer 34 in practice has a relatively high resistance as it is relatively thin.

Figure 6E:
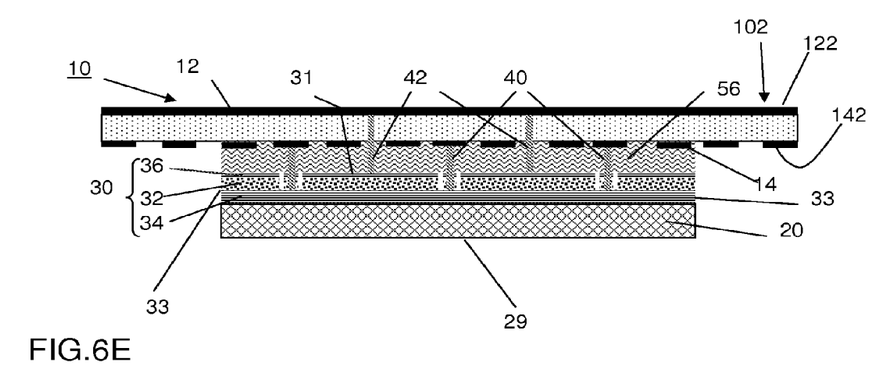

When the cover 10 of FIG. 5A, 5B is used the ends of the electrical conductors 40 should coincide with the ends of the electrical feedthrough elements 17 and the ends of the electrical conductors 42 should coincide with the remaining surface of the patterned electrically conductive layer 14. Alternatively, the ends of the electrical conductors 42 may coincide with the ends of the electrical feedthrough elements 17 and the ends of the electrical conductors 40 may coincide with the remaining surface of the patterned electrically conductive layer 14. The result of the latter combination is shown in FIG. 6E. In FIG. 6E the cover 10 extends beyond said first main surface 31 of the opto-electrical structure 30. In this way both the metal foil 12 and the patterned electrically conductive layer 14 can be easily connected to an external power source at contacts formed by portions 122, 142 of the metal foil 12 and the patterned electrically conductive layer 14 respectively at the extending portion 102 of the cover. In order to prevent that moisture and other malignant substances in the atmosphere penetrate in to the opto-electrical structure 30, the sidefaces 33 may be provided with a barrier layer in addition to the barrier structure 20.

In a further step the cover 10 may be wrapped around the opto-electrical structure 30, and adhered against the outward facing surface 29 of the barrier structure 20 so that the device according to the embodiment of FIG. 1 is obtained. Therein the opto-electrical structure 30 is fully encapsulated by the barrier structure 20 in combination with the cover 10. The cover 10 herein has a dual function as it also provides for a distributed power supply to both electrodes of the opto-electrical structure. In an alternative embodiment the opto-electrical structure may be a photo-voltaic structure. In that case the cover 10 functions as a power network for collecting the current generated in the full area of the photo-voltaic structure.

FIG. 7A to 7H show a method according to the second aspect for manufacturing the opto-electrical device according to the first aspect as shown in FIG. 2.

In each of the FIGS. 7A to 7G, the bottom part shows a top-view of the device or an intermediate product resulting in the device. The top part shows the corresponding cross-section as indicated for example by X-X in FIG. 7A.

Figure 7A:
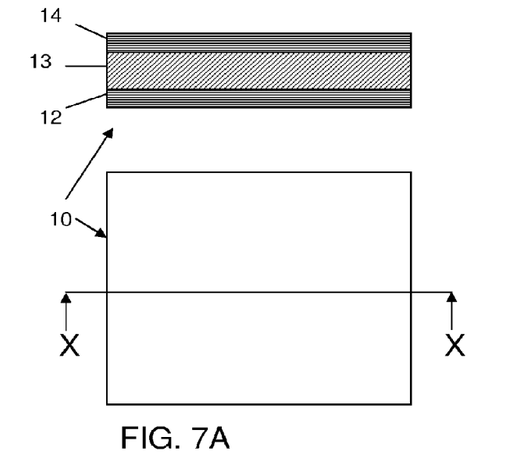
FIG. 7A to 7H show a second embodiment of a method according to the second aspect of the present invention.
Figure 7B:
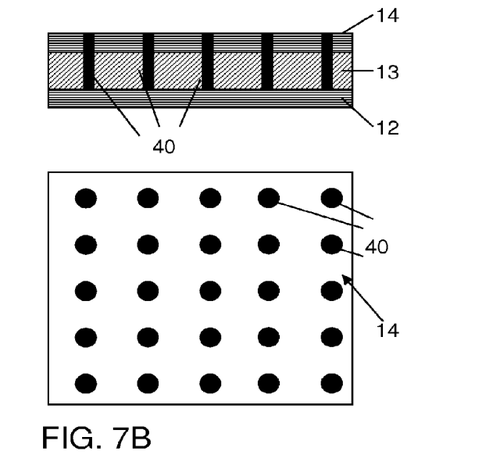

FIG. 7A shows a metal foil 12 that is laminated with a polymer foil 13 cladded with a metal layer 14. Such laminated products are generally available. Alternatively the laminated product may be provided as part of the method according to the second aspect. The metal layer 14 and the electrically insulating layer formed by the polymer foil 13 are provided with openings that give access to the metal foil 12. In practice the openings are provided simultaneously, preferably by laser drilling. The metal layer 14 therewith becomes a patterned electrically conductive layer. FIG. 7B shows the result of a subsequent step wherein an electrically conductive material is applied in the openings in the electrically insulating layer 13 and the metal layer 14. Therewith transverse electrical conductors 40 are formed.

Figure 7C:
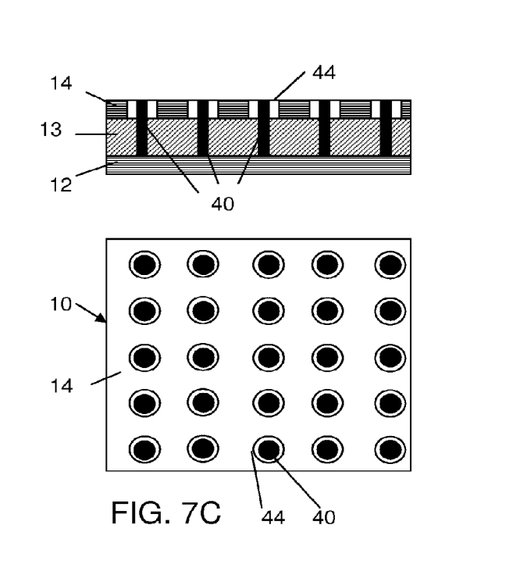
Figure 7D:
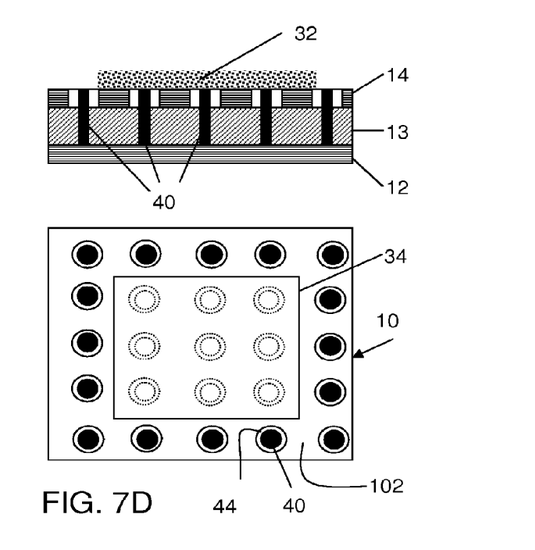
Figure 7E:
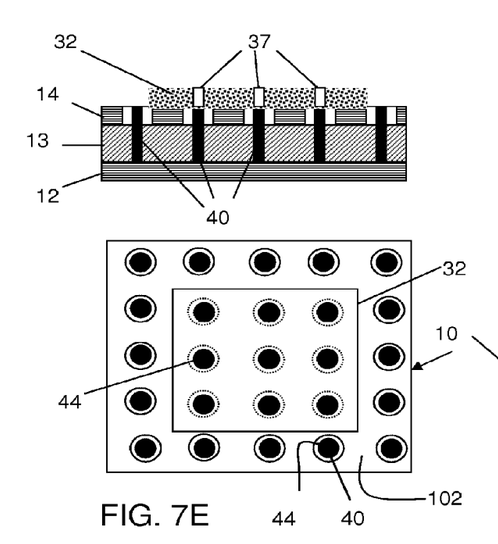
Figure 7F:
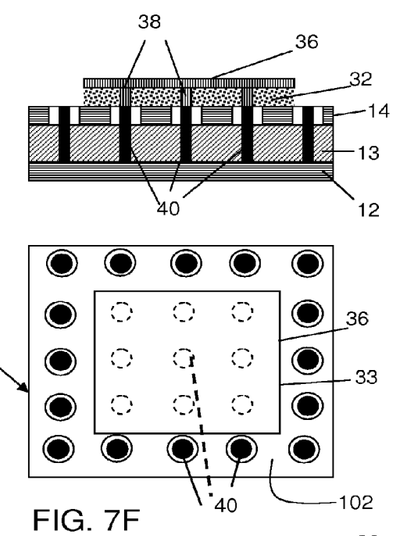
Figure 7G:
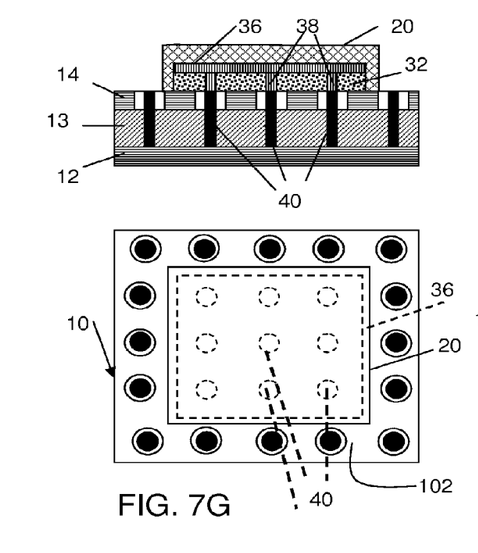
Figure 7H:
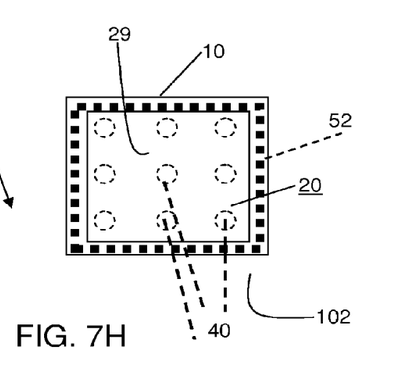

In a next step (shown in FIG. 7C) a ring-shaped portion 44 is removed from the metal layer 14 around each of the conductors 40 that were formed by deposition of the paste in the openings. Therewith the conductors 40 are electrically insulated from the patterned electrically conductive layer 14. The ring-shaped portion 44 may be filled with an electrically insulating material. In FIG. 7D it is shown how an opto-electrical layer 32 is deposited at the second electrically conductive layer, e.g. by spin-coating or printing. Although in the embodiment shown only a single opto-electrical layer 32 is shown, a plurality of such layers may be deposited. In addition auxiliary layers may be deposited, such as hole-injection layer, a hole transport layer, an electron injection layer and an electron transport layer. Although in the embodiment shown the portion of the cover 10 provided with the opto-electrical layer 32 comprises a grid of 3×3 transverse electrical conductors 40, in practice a lower or a higher number of transverse electrical conductors 40 may be present depending on the size of the product (e.g. from a few square cm to several tens or hundreds of square meters) and the conductivity of the transverse electrical conductors 40. It can be seen in FIG. 7D that the cover 10 extends beyond a surface defined by the opto-electric layer 32 or the stack of layer comprising the opto-electric layer 32. In this case the entire periphery 102 of the cover 10 extends beyond the surface defined by the opto-electric layer 32. It is noted that in the embodiment shown the pattern of transverse electrical conductors 40 also extends over the periphery 102. This is not necessary. In the periphery 102 of the cover 10 the transverse electrical conductors 40 may be absent and the metal layer 14 may be continuous in the periphery 102. Nevertheless it may be advantageous that the pattern extends over the full area of the cover 10, so that an arbitrary selected portion of a semifinished product of arbitrary size may be used as shown in FIG. 7C. After the opto-electrical layer 32 or stack comprising such a layer is applied, the ends of the conductors 40 are exposed again by locally ablating the opto-electrical layer 32, resulting in openings 37 before the free ends of the conductors 40. FIG. 7E shows the result of this step. A transparent electrically conductive layer 36 is deposited as shown in FIG. 7F. The material for this layer 36, when deposited also fills the openings 37 in the opto-electrical layer 32 and forms therein an electrically conductive portion 38, provided that the openings 37 are sufficiently wide and superficial e.g. if the width of the opening is at least 10 times the height of the opening. This can be realized easily as the opto-electric functional layer and supporting layers, such as a hole-injection layer can have a relative modest thickness, together in the order of a few hundred nm. As is shown in FIG. 7F, therewith the transparent electrically conductive layer 36 is electrically connected with the metal foil 12, via the transverse electrical conductors formed by the transverse electrical conductors 40 and the electrically conductive portions 38. The semi-finished product of FIG. 7F is now provided with a barrier structure 20 as shown in FIG. 7G. The barrier structure 20 is for example a stack comprising an organic layer sandwiched between a first and a second inorganic layer or a stack of inorganic layers of at least two different inorganic materials that alternate each other. The barrier structure 20 covers the stack formed by the opto-electric layer 32 and the transparent electrically conductive layer 36 and may also cover the side faces 33 as is shown in 7F. In combination with the cover 10, therewith the device of FIG. 7G is already substantially protected against substances in the atmosphere. Both electrodes, the transparent electrically conductive layer 36 and the patterned electrically conductive layer 14, can be easily connected to an external power source by forming an electrical connection to the patterned electrically conductive layer 14 and the metal foil 12 in the periphery 102 of the cover 10. Of course the metal foil may be contacted in any zone that is exposed.

In a further step, the periphery of the cover 10 may be wrapped around the periphery of the stack comprising the opto-electrical layer 32 enclosed by the barrier structure 20 and adhered to the surface 29 with a sealant 52. In addition the foil may be adhered with its surface formed by the patterned electrically conductive layer 14 against an electrical contact 144, therewith obtaining the embodiment of the device shown in FIG. 2. Alternatively the cover 10 may have a free edge-portion 102 that extends beyond the adhesion zone 54 and that is bent away from the barrier structure 20 in a way analogous as shown in FIG. 3

It will be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In the claims the word "comprising" does not exclude other elements or steps, and the indefinite article "a" or "an" does not exclude a plurality. A single component or other unit may fulfill the functions of several items recited in the claims. The mere fact that certain measures are recited in mutually different claims does not indicate that a combination of these measures cannot be used to advantage. Any reference signs in the claims should not be construed as limiting the scope.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The invention claimed is:

1. An opto-electrical device comprising a cover, a barrier structure, an opto-electrical structure, a first plurality of transverse electrical conductors and a second plurality of transverse electrical conductors; wherein:

the cover comprises a metal foil and a patterned electrically conductive layer; wherein the patterned electrically conductive layer is disposed on an electrically insulating layer electrically insulating the patterned electrically conductive layer from the metal foil, the opto-electrical structure is sandwiched between the cover and the barrier structure, wherein the opto-electrical structure comprises at least an opto-electrical layer, a transparent electrically conductive layer, and an electrode layer; the opto-electrical structure having a first main surface facing towards the cover, the first plurality of transverse electrical conductors extend from the patterned electrically conductive layer of the cover to the transparent electrically conductive layer and the second plurality of transverse electrical conductors extend from the metal foil to the electrode layer through openings in the patterned electrically conductive layer such that the second plurality of transverse electrical conductors are electrically insulated from the patterned electrically conductive layer, the cover extends beyond said first main surface the opto-electrical structure, and is wrapped around at least one side face of the opto-electrical device over the barrier structure.

2. A method for manufacturing an opto-electrical device comprising the steps of:
providing a cover comprising a metal foil, and a patterned electrically conductive layer wherein the patterned electrically conductive layer is disposed on an electrically insulating layer electrically insulating the patterned electrically conductive layer from the metal foil,
providing an opto-electrical structure that comprises at least an electrode layer, an opto-electrical layer and a transparent electrically conductive layer, the opto-electrical structure having a first main surface facing towards the cover,
providing a first plurality of transverse electrical conductors that extend from the patterned electrically conductive layer of the cover to the transparent electrically conductive layer,
providing a second plurality of transverse electrical conductors that extend from the metal foil to the electrode layer through openings in the patterned electrically conductive layer such that the second plurality of transverse electrical conductors are electrically insulated from the patterned electrically conductive layer,
providing a barrier structure, wherein the opto-electrical structure is sandwiched between the cover and the barrier structure, and
wherein the cover extends beyond said first main surface of the opto-electrical structure,
wherein a portion of the cover extending beyond said first main surface of the opto-electrical structure is wrapped around a circumference of the opto-electrical structure over a free surface of the barrier structure.

3. The method according to claim 2, wherein said opto-electrical structure provided with the barrier structure and said cover are manufactured separately and wherein said opto-electrical structure and said cover are mutually integrated into the opto-electrical device by laminating the opto-electrical structure at the cover, the cover therewith extending beyond the first main surface of the opto-electrical structure.

4. The method according to claim 3, wherein before laminating, the opto-electrical structure is provided with the first and second plurality of transverse electrical conductors.

5. The method according to claim 4, wherein the first main surface of the opto-electrical structure and the cover are laminated together with an electrically insulating adhesive layer and wherein the first and second plurality of transverse electrical conductors are applied through the adhesive layer.

6. The method according to claim 2, wherein a portion of the free surface of the barrier structure is provided with a sealant, and wherein the wrapped around portion of the cover extends at least partially over said portion of the free surface of the barrier structure.

7. The method according to claim 6, wherein said wrapped around portion of the cover that extends at least partially over said portion of the free surface of the barrier structure is applied as an electrical contact at the free surface of the barrier structure and is wrapped around at least one side face of the device over the barrier structure, wherein the contact is connectable to a power supply.

8. The method according to claim 2, wherein the patterned electrically conductive layer is a grid, that is electrically insulated from the metal foil by the electrically insulating layer; wherein the patterned electrically conductive layer is applied as a pattern that defines openings in areas of the electrically insulating layer not covered by the patterned electrically conductive layer that give access to the metal foil at a side of the cover facing the opto-electrical structure and wherein said wrapped around portion of the cover that extends at least partially over a portion of the free surface of the barrier structure is bent toward from the barrier structure, therewith exposing a contact of the patterned electrically conductive layer; wherein the contact is connectable to a power supply.

9. The opto-electrical device according to claim 1, wherein the patterned electrically conductive layer is a grid, that is electrically insulated from the metal foil by the electrically insulating layer; wherein the patterned electrically conductive layer is applied as a pattern that defines openings in areas of the electrically insulating layer not covered by the patterned electrically conducted layer that give access to the metal foil at a side of the cover facing the opto-electrical structure.

* * * * *